(12) United States Patent
Benagli et al.

(10) Patent No.: US 8,652,871 B2
(45) Date of Patent: Feb. 18, 2014

(54) METHOD FOR DEPOSITING AN AMORPHOUS SILICON FILM FOR PHOTOVOLTAIC DEVICES WITH REDUCED LIGHT-INDUCED DEGRADATION FOR IMPROVED STABILIZED PERFORMANCE

(75) Inventors: Stefano Benagli, Neuchâtel (CH); Daniel Borrello, Cortaillod (CH); Evelyne Vallat-Sauvain, Chezard-St. Martin (CH); Johannes Meier, Corcelles (CH); Ulrich Kroll, Corcelles (CH)

(73) Assignee: Tel Solar AG, Trubbach (CH)

( * ) Notice: Subject to any disclaimer, the term of this patent is extended or adjusted under 35 U.S.C. 154(b) by 175 days.

(21) Appl. No.: 13/060,345

(22) PCT Filed: Aug. 26, 2009

(86) PCT No.: PCT/CH2009/000284
§ 371 (c)(1),
(2), (4) Date: Apr. 20, 2011

(87) PCT Pub. No.: WO2010/022527
PCT Pub. Date: Mar. 4, 2010

(65) Prior Publication Data
US 2011/0186127 A1   Aug. 4, 2011

Related U.S. Application Data

(60) Provisional application No. 61/092,949, filed on Aug. 29, 2008.

(51) Int. Cl.
*H01L 31/20* (2006.01)
*H01L 31/075* (2012.01)

(52) U.S. Cl.
USPC ............... 438/96; 136/258; 257/E33.046

(58) Field of Classification Search
USPC .............................................. 438/96
See application file for complete search history.

(56) References Cited

U.S. PATENT DOCUMENTS

| | | | | |
|---|---|---|---|---|
| 5,419,781 A | * | 5/1995 | Hamakawa et al. | 136/244 |
| 5,419,783 A | * | 5/1995 | Noguchi et al. | 438/93 |
| 5,421,909 A | * | 6/1995 | Ishikawa et al. | 136/256 |
| 5,538,564 A | * | 7/1996 | Kaschmitter | 136/255 |
| 5,627,081 A | * | 5/1997 | Tsuo et al. | 438/57 |

(Continued)

FOREIGN PATENT DOCUMENTS

| | | |
|---|---|---|
| EP | 0500067 A2 | 8/1992 |
| GB | 2135512 A | 8/1984 |

OTHER PUBLICATIONS

Shah et al., Material and solar cell research in microcrystalline silicon, Solar Energy Materials & Solar Cells, 78, 2003, pp. 469-491.*

(Continued)

*Primary Examiner* — David Vu
*Assistant Examiner* — Earl Taylor
(74) *Attorney, Agent, or Firm* — Pearne & Gordon LLP

(57) ABSTRACT

A thin film photovoltaic device on a substrate is being realized by a method for manufacturing a p-i-n junction semiconductor layer stack with a p-type microcrystalline silicon layer, a p-type amorphous silicon layer, a buffer silicon layer comprising preferably intrinsic amorphous silicon, an intrinsic type amorphous silicon layer, and an n-type silicon layer over the intrinsic type amorphous silicon layer.

13 Claims, 2 Drawing Sheets

Figure 1:
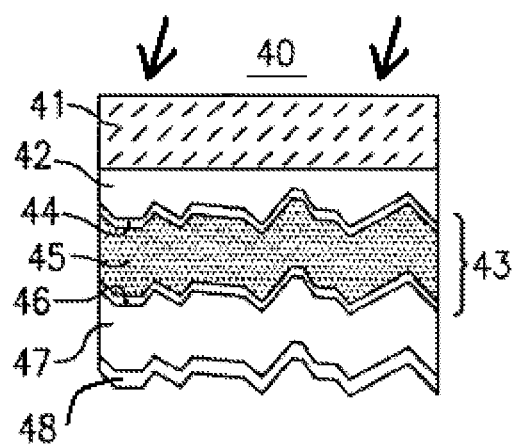

| Layer | Temp. [°C] | Frequ. [MHz] | Press. [mbar] | SiH4 [sccm] | H2 [sccm] | CH4 [sccm] | TMB in H2 2% [sccm] | PH3 in H2 2ppm [sccm] | Power [W] | Time [sec] | Rate (A/sec) | Thickness [nm] |
|---|---|---|---|---|---|---|---|---|---|---|---|---|
| (1) p(µc-Si:H) | 200 | 40.68 | 2 | 8.2 | 1525 | | 2.9 | | 400 | 110 | 0.95 | 10.5 |
| (2) p(a-Si:H) | 200 | 40.68 | 0.5 | 48 | 88 | 94 | 69 | | 40 | 35 | 2.60 | 9.1 |
| (3) b(a-Si:H) | 200 | 40.68 | 0.5 | 38 | 358 | 8 | | | 70 | 70 | 1.42 | 9.9 |
| (4) i(a-Si:H) | 200 | 40.68 | 0.5 | 92 | 84 | | | | 78 | 800 | 3.30 | 264 |
| (5) n(a-Si:H) | 200 | 40.68 | 0.5 | 56 | 166 | | | 140 | 78 | 30 | 1.8 | 5.4 |
| (6) n(µc-Si:H) | 200 | 40.68 | 2 | 7.4 | 684 | | | 92 | 400 | 210 | 0.8 | 16.8 |

(56) References Cited

U.S. PATENT DOCUMENTS

| | | | |
|---|---|---|---|
| 5,716,480 A * | 2/1998 | Matsuyama et al. | 136/249 |
| 5,913,986 A * | 6/1999 | Matsuyama | 136/255 |
| 5,942,049 A * | 8/1999 | Li et al. | 136/258 |
| 6,043,427 A * | 3/2000 | Nishimoto | 136/258 |
| 6,242,686 B1 * | 6/2001 | Kishimoto et al. | 136/255 |
| 6,309,906 B1 * | 10/2001 | Meier et al. | 438/69 |
| 6,472,248 B2 * | 10/2002 | Shiozaki et al. | 438/97 |
| 7,064,263 B2 * | 6/2006 | Sano et al. | 136/249 |
| 7,671,271 B2 * | 3/2010 | Sichanugrist et al. | 136/258 |
| 7,700,165 B2 * | 4/2010 | Takai et al. | 427/569 |
| 2004/0135221 A1 * | 7/2004 | Kroll et al. | 257/458 |
| 2008/0173348 A1 * | 7/2008 | Nasuno et al. | 136/255 |
| 2008/0173350 A1 * | 7/2008 | Choi et al. | 136/258 |
| 2008/0223440 A1 * | 9/2008 | Sheng et al. | 136/258 |
| 2009/0183771 A1 * | 7/2009 | Sannomiya et al. | 136/258 |
| 2010/0132791 A1 * | 6/2010 | Kim | 136/258 |

OTHER PUBLICATIONS

Guha et al., Progress in amorphous and nanocrystalline silicon solar cells, Journal of Non-Crystalline Solids, 352, 2006, 1917-1921.*

Tsuo et al., Solar Cell Structures Combining Amorphous, Microcrystalline, and Single-Cyrstalline Silicon, IEEE, 1993, pp. 281-286.*

International Search Report for PCT/CH2009/000284 dated Jan. 13, 2010.

Written Opinion for PCT/CH2009/000284 dated Jan. 13, 2010.

Platz, et. al., "H2-dilution vs. Buffer Layers for Increased Voc," Amorphous silicon Technology—1996 Symposium, Apr. 8-12, 1996, pp. 51-56.

Shah, et al., "Thin-film Silicon Solar Cell Technology," Progress in Photovoltaics: Research and Applications, Mar.-May 2004, pp. 113-142.

Guha, et al., "Microcrystalline Silicon Solar Cells- Final Technical Progress Report," National Renewable Energy Laboratory-Final Technical Progress Report, May 2005, pp. 1-32.

* cited by examiner

| Layer | Temp. [°C] | Frequ. [MHz] | Press. [mbar] | SiH4 [sccm] | H2 [sccm] | CH4 [sccm] | TMB in H2 2% [sccm] | PH3 in H2 2ppm [sccm] | Power [W] | Time [sec] | Rate (Å/sec) | Thickness [nm] |
|---|---|---|---|---|---|---|---|---|---|---|---|---|
| (1) p(μc-Si:H) | 200 | 40.68 | 2 | 8.2 | 1525 | | 2.9 | | 400 | 110 | 0.95 | 10.5 |
| (2) p(a-Si:H) | 200 | 40.68 | 0.5 | 48 | 88 | 94 | 69 | | 40 | 35 | 2.60 | 9.1 |
| (3) b(a-Si:H) | 200 | 40.68 | 0.5 | 38 | 358 | 8 | | | 70 | 70 | 1.42 | 9.9 |
| (4) i(a-Si:H) | 200 | 40.68 | 0.5 | 92 | 84 | | | | 78 | 800 | 3.30 | 264 |
| (5) n(a-Si:H) | 200 | 40.68 | 0.5 | 56 | 166 | | | 140 | 78 | 30 | 1.8 | 5.4 |
| (6) n(μc-Si:H) | 200 | 40.68 | 2 | 7.4 | 684 | | | 92 | 400 | 210 | 0.8 | 16.8 |

FIG. 2

METHOD FOR DEPOSITING AN AMORPHOUS SILICON FILM FOR PHOTOVOLTAIC DEVICES WITH REDUCED LIGHT-INDUCED DEGRADATION FOR IMPROVED STABILIZED PERFORMANCE

FIELD OF THE INVENTION

The present invention relates to improvements in the overall manufacturing process for thin-film, silicon-based solar cells or modules relying on the so called amorphous multiple- or single-junction structures.

BACKGROUND ART

Photovoltaic devices, photoelectric conversion devices or solar cells are devices which convert light, especially sunlight into direct current (DC) electrical power. For low-cost mass production thin film solar cells are being of interest since they allow using glass, glass ceramics or other rigid or flexible substrates as a base material (substrate) instead of crystalline or polycrystalline silicon. The solar cell structure, i. e. the layer sequence responsible for or capable of the photovoltaic effect is being deposited in thin layers. This deposition may take place under atmospheric or vacuum conditions. Deposition techniques are widely known in the art, such as PVD, CVD, PECVD, APCVD, . . . all being used in semiconductor technology.

A thin-film solar cell generally includes a first electrode, one or more semiconductor thin-film p-i-n or n-i-p junctions, and a second electrode, which are successively stacked on a substrate. Each p-i-n junction or thin-film photoelectric conversion unit includes an i-type layer sandwiched between a p-type layer and an n-type layer (p-type=positively doped, n-type=negatively doped). The i-type layer, which is a substantially intrinsic semiconductor layer, occupies the most part of the thickness of the thin-film p-i-n junction. Photoelectric conversion occurs primarily in this i-type layer.

Prior Art FIG. 1 shows a basic, simple photovoltaic cell 40 comprising a transparent substrate 41, e. g. glass with a layer of a transparent conductive oxide (TCO) 42 deposited thereon. This layer is also called front contact F/C and acts as first electrode for the photovoltaic element. The next layer 43 acts as the active photovoltaic layer and comprises three "sub-layers" forming a p-i-n junction. Said layer 43 comprises hydrogenated microcrystalline, nanocrystalline or amorphous silicon or a combination thereof. Sublayer 44 (adjacent to TCO front contact 42) is positively doped, the adjacent sub-layer 45 is intrinsic, and the final sub-layer 46 is negatively doped. In an alternative embodiment the layer sequence p-i-n as described can be inverted to n-i-p, then layer 44 is identified as n-layer, layer 45 again as intrinsic, layer 46 as p-layer. Finally, the cell includes a rear contact layer 47 (also called back contact, B/C) which may be made of zinc oxide, tin oxide or ITO and a reflective layer 48. Alternatively a metallic back contact may be realized, which can combine the physical properties of back reflector 48 and back contact 47. For illustrative purposes, arrows indicate impinging light.

Depending on the crystallinity of the i-type layer solar cells or photoelectric (conversion) devices are characterized as amorphous (a-Si) or microcrystalline (pc-Si) solar cells, independent of the kind of crystallinity of the adjacent p and n-layers. Microcrystalline layers are being understood, as common in the art, as layers comprising at least a Raman crystallinity of 15% of microcrystalline crystallites in an amorphous matrix.

Nowadays, efficiency of solar cells and low cost production are of increasing interest. Multiple-junction solar cells with at least two thin-film photoelectric conversion units stacked one on the other are highly efficient; however need increased effort in manufacturing equipment. Moreover, the deposition rate for microcrystalline silicon with PECVD methods in tandem (double-junction) solar cells is considerably lower than the rate of amorphous layers (under otherwise comparable conditions). Therefore, there is a need for low-cost high efficient amorphous silicon solar cells.

Today, thin film solar cells are heading for mass-production. Requirement for such mass production are integrated manufacturing processes, allowing efficiently and effectively manufacturing such cells. Yield, throughput, uptime, quality are ingredients to observe in such processes. On the other hand, a clear goal is to increase cell efficiency and other electrical properties of the solar cells. However, the so called Stabler-Wronski effect describes the tendency of amorphous silicon photovoltaic devices to degrade (drop) in their electricity conversion efficiency upon initial exposure to light. Light-soaking experiments which are internationally accepted, include exposing the test devices under AM1.5-like illumination at a controlled temperature of 50° C. during 1000 hrs. The stabilized performances are evaluated at standard conditions (AM1.5 1000 W/m$^2$, 25° C.) and the relative efficiency degradation is given by the difference between the initial (before light-soaking exposure) and the degraded efficiency (after 1000 hrs) normalized to the initial efficiency. Therefore efficiency is not only important as an initial value but also as a stabilized value. Values of about 20% or more for the relative degradation as known in the art for a single-junction amorphous silicon cell with an i-layer thickness larger than 200 nm are a serious obstacle for the commercialisation of such PV cells.

SUMMARY OF THE INVENTION

This invention relates to a process for the manufacturing of thin film photovoltaic devices that can, for example, be used in architectural applications. While this invention is not limited to a specific type of thin film photovoltaic device, this invention is particularly suitable for the production of thin film photovoltaic devices comprising an amorphous cell structure with an a-Si intrinsic layer thickness larger than 200 nm, that display a relative efficiency degradation below 20% and even, for one embodiment of the invention, below 16.5%.

Generally, a thin film photovoltaic device comprises a substrate, preferably a transparent vitreous substrate, usually with a thickness of 0.4 mm to 5 mm, preferably 2 mm to 4 mm, an electrically conductive contact on the substrate, one or more semiconductor layers which generate an electric charge separation upon exposure to light, and a second electrically conductive contact. The semiconductor layer or layers are positioned between the electrically conductive contacts. The semiconductor layers are deposited in a manner that provides for a junction; preferably the photovoltaic devices according to this invention exhibit at least one p-i-n junction or at least one n-i-p junction although other types of semiconductor junctions can be utilized. The p-i-n junction can be realized in a semiconductor comprising p-, i- and n-regions or layers. The i-region is an intrinsic region, the p-region is typically a positively doped region, and the n-region is typically a negatively doped region. Region, in the context of this invention means comprising at least one layer with at least one common property.

The i-region is positioned between the p- and n-regions in the p-i-n junction or the n-i-p junction. It is generally understood that when light, for example, solar radiation, impinges on a photoelectric device containing a p-i-n or n-i-p junction, electron-hole pairs are generated in the i-region. The holes from the generated pair are directed towards the p-region and the electrons towards the n-region. The contacts are generally directly or indirectly in contact with the p- and n-regions. Current will flow through an external circuit connecting these contacts as long as light continues to impinge on the photoelectric device thereby generating electron-hole pairs.

According to a process of this invention the substrate used to form photovoltaic devices can be any suitable substrate for receiving the electrically conductive contact and semiconductor layers of the photovoltaic device. The substrate is generally flat and can be glass, glass-ceramics, ceramics or other glass-like material, a plastic such as a polyimide, or a metal film such as aluminum, steel, titanium, chromium, iron, and the like. Glass, particularly a highly transparent or transmissive glass is preferred. The substrate can be in any size and shape, provided it can fit into the processing equipment used in the process of this invention. If larger substrate sizes are desired, the processing equipment as mentioned herein will need to be sized accordingly. However, in order to meet the goal of efficiently producing solar modules, standardization is desirable.

One size common in the market today is a 1.4 m$^2$ glass substrate with 1.1 m×1.3 m. This invention however is not limited to this size and may be successfully applied to other sizes and shapes, be it either rectangular or square.

DETAILED DESCRIPTION OF THE INVENTION

The inventive process as described in more detail below results in an amorphous pin cell deposited on a front TCO of high stabilized efficiency, including multiple junction device structures where such an amorphous pin cell is part of.

Following a structure as shown in FIG. 1, on a glass substrate 41 a TCO layer 42 made from ZnO by means of LPCVD has been deposited. However, other layers and other deposition methods may be used, e. g. SnO$_2$ as described above. In one embodiment a ZnO TCO layer with 1.8 μm thickness, resistivity: 1.6 10$^{-3}$ ohmscm, more than 10% haze and a total transmission with index matching (400 to 900 nm) of above 80% have been deposited with a TCO 1200 LPCVD system, commercially available from Oerlikon Solar.

A subsequent p-i-n junction semiconductor layer stack 43 was formed from a-Si:H (hydrogenated amorphous silicon)or microcrystalline silicon or both. FIG. 2 shows details of one possible embodiment of the invention, where a p and a n region each comprising (sub)layers with comparable doping have been used. Layer (1) and (2) according to FIG. 2 establish a p region, comprising a microcrystalline and an amorphous sublayer. Layer (3) is a buffer layer of amorphous silicon deposited with high hydrogen flux. Layer (4) is an intrinsic a-Si:H layer deposited at more than 3 Å/s (5) and (6) establish the n region of said p-i-n junction.

Between the deposition steps resulting in layer (2) and (3) a flush with water vapor of more than 100 sccm for more than 30 sec at 0.2 mbar followed by a pumping of more than 30 sec was performed following the teachings of U.S. Pat. No. 7,344,909.

Finally a further TCO layer as back contact 47 has been realized and a back reflector 48 has been added in order to send back into the light absorbing i-layer the initially not trapped light. Both such processes and layers are well known in the art. This cell achieved a stabilized efficiency above 9% compared to an initial value of 10.9% resulting in a relative degradation of 16.5%.

The embodiment described in FIG. 2 is exemplary for the results described. However, the processing temperature can be varied between 180 and 250° C. without compromising a stabilized efficiency of 9%. A frequency between 13.56 MHz and 82 MHz (harmonics of 13.56 MHz) can be successfully employed. Basically the ratios between SiH$_4$, H$_2$ and dopants (if any)CH$_4$, TMB, PH$_3$ are crucial and can be easily derived from FIG. 2. The Power applied to the process chamber will influence the desired deposition rate but will also influence the crystallinity of the layer and its stability. Since the cells in this example had the size of 1 cm$^2$, the respective power density per cm$^2$ can be easily derived from FIG. 2.

The manufacturing process for the amorphous silicon layers was performed on a KAI PECVD deposition system, as commercially available from Oerlikon Solar. The ZnO layer was deposited on a known as TCO 1200, also from Oerlikon Solar.

The invention claimed is:

1. A method of forming a thin film photovoltaic device on a substrate with an electrically conductive contact, comprising:
    forming a p-i-n junction semiconductor layer stack comprising:
        forming a p-type microcrystalline silicon layer on said electrically conductive contact;
        forming a p-type amorphous silicon layer on said p-type microcrystalline silicon layer;
        forming an intrinsic type amorphous buffer silicon layer with high hydrogen flux on said p-type amorphous silicon layer and increasing an atomic percentage of hydrogen in said intrinsic type amorphous buffer silicon layer relative to said p-type amorphous silicon layer;
        forming an intrinsic type amorphous silicon layer on said intrinsic type amorphous buffer silicon layer; and
        forming an n-type silicon layer over the intrinsic type amorphous silicon layer.

2. A method according to claim 1, wherein the silicon layers comprise hydrogenated silicon generated from a gas mixture comprising at least silane and hydrogen.

3. A method according to claim 2, wherein the p-type amorphous silicon layer and the buffer silicon layer are deposited in a gas mixture further comprising methane.

4. A method according to claim 1 or 2, wherein the p-type amorphous silicon layer and the p-type microcrystalline silicon layer are deposited in a gas mixture comprising boron.

5. A method according to claim 3, wherein a ratio of silane flux in sccm to the hydrogen flux in sccm during deposition of the buffer silicon layer is substantially 10:94, and said ratio during deposition of the intrinsic type amorphous silicon layer is substantially 10:9.

6. A method according to claim 3 wherein a ratio of silane flux in sccm to the hydrogen flux in sccm to methane flux in sccm during deposition of the p-type amorphous silicon layer is substantially 10:18:19.

7. A method according to claim 5, wherein a ratio of the silane flux in sccm to the hydrogen flux in sccm to methane flux in sccm during deposition of the buffer silicon layer is substantially 10:94:2.

8. A method according to claim 1, wherein forming the n-type silicon layer comprises
    forming an n-type amorphous silicon layer; and
    forming an n-type microcrystalline silicon layer.

9. A silicon based thin film photovoltaic device comprising, on a substrate,
    an electrically conductive contact and subsequently a p-i-n junction semiconductor layer stack with:

a p-type microcrystalline silicon layer;

a p-type amorphous silicon layer on said p-type microcrystalline silicon layer;

an intrinsic type amorphous buffer silicon layer on said p-type amorphous silicon layer, an atomic percentage of hydrogen in said intrinsic type amorphous buffer silicon layer being increased relative to said p-type amorphous silicon layer;

an intrinsic type amorphous silicon layer on said intrinsic type amorphous buffer silicon layer;

an n-type silicon layer over the intrinsic type amorphous silicon layer.

10. A photovoltaic device according to claim 9 wherein the n-type silicon layer comprises an n-type amorphous silicon layer and an n-type microcrystalline silicon layer.

11. A photovoltaic device according to claim 9 or 10, wherein the buffer silicon layer comprises an intrinsic type hydrogenated amorphous silicon layer doped with carbon.

12. A method according to claim 1, further comprising:

elevating the atomic percentage of hydrogen in said intrinsic type amorphous buffer silicon layer relative to said p-type amorphous silicon layer by forming said intrinsic type amorphous buffer silicon layer with a hydrogen-to-silane flow ratio that exceeds ten times the hydrogen-to-silane flow ratio for forming said p-type amorphous silicon layer.

13. A method according to claim 12, further comprising:

elevating the atomic percentage of hydrogen in said intrinsic type amorphous buffer silicon layer relative to said p-type amorphous silicon layer by forming said intrinsic type amorphous buffer silicon layer with a hydrogen-to-silane flow ratio that exceeds ten times the hydrogen-to-silane flow ratio for forming said intrinsic type amorphous silicon layer.

* * * * *

UNITED STATES PATENT AND TRADEMARK OFFICE
CERTIFICATE OF CORRECTION

PATENT NO. : 8,652,871 B2  Page 1 of 1
APPLICATION NO. : 13/060345
DATED : February 18, 2014
INVENTOR(S) : Benagli et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 230 days.

Signed and Sealed this
Twenty-ninth Day of September, 2015

Michelle K. Lee
*Director of the United States Patent and Trademark Office*